United States Patent
Sawada et al.

(10) Patent No.: US 6,423,244 B1
(45) Date of Patent: *Jul. 23, 2002

(54) PIEZOELECTRIC CERAMIC COMPOSITION AND PIEZOELECTRIC CERAMIC DEVICE USING THE SAME

(75) Inventors: Takuya Sawada, Moriyama; Masahiko Kimura, Kusatsu; Akira Ando, Omihachiman; Koichi Hayashi, Shiga-ken, all of (JP)

(73) Assignee: Murata Manufacturing Co. Ltd. (JP)

( * ) Notice: Subject to any disclaimer, the term of this patent is extended or adjusted under 35 U.S.C. 154(b) by 23 days.

This patent is subject to a terminal disclaimer.

(21) Appl. No.: 09/639,600

(22) Filed: Aug. 16, 2000

(30) Foreign Application Priority Data

Aug. 26, 1999 (JP) .............................. 11-240144
Apr. 18, 2000 (JP) .............................. 2000-11677

(51) Int. Cl.[7] .............................. H01B 3/12; H01G 4/12; H01L 41/00; H03H 9/00
(52) U.S. Cl. ............................... 252/62.9 R; 501/134; 501/135
(58) Field of Search ................ 501/134, 135; 252/62.9 R

(56) References Cited

U.S. PATENT DOCUMENTS 6,117,354 A  9/2000  Kimura et al. ......... 252/62.9 R
6,258,291 B1 * 7/2001  Kimura et al. ......... 252/62.9 R

OTHER PUBLICATIONS

WPI Abstract Accession No. 2000–014761[02] & JP 110322426 A (Murata); Nov. 24, 1999.
WPI Abstract Accession No. 1974–06395V[04] & JP480077398 A (TDK Electronics); Oct. 17, 1973 (Abstract).

* cited by examiner

*Primary Examiner*—C. Melissa Koslow
(74) *Attorney, Agent, or Firm*—Dickstein, Shapiro, Morin & Oshinsky, LLP.

(57) ABSTRACT

A piezoelectric ceramic composition mainly contains a component of the formula $SrBi_2Nb_2O_9$ and includes at least a trivalent metallic element other than Bi constituting the main component in a proportion of more than 0 mol and equal to or less than about 0.15 mol relative to 1 mol of Bi in the main component. This piezoelectric ceramic composition mainly containing $SrBi_2Nb_2O_9$ is useful as a material for a piezoelectric ceramic device having an improved temperature-dependent factor of resonant frequency. Such a satisfactory piezoelectric ceramic device is also provided using this piezoelectric ceramic composition.

20 Claims, 1 Drawing Sheet

PIEZOELECTRIC CERAMIC COMPOSITION AND PIEZOELECTRIC CERAMIC DEVICE USING THE SAME

BACKGROUND OF THE INVENTION

1. Field of the Invention

The present invention relates to piezoelectric ceramic compositions and piezoelectric ceramic devices using the compositions. Particularly, the present invention relates to piezoelectric ceramic compositions which are useful as, for example, materials for piezoelectric ceramic filters, piezoelectric ceramic oscillators, piezoelectric ceramic resonators and other piezoelectric ceramic devices, and piezoelectric ceramic devices using the compositions.

2. Description of the Related Art

Piezoelectric ceramic compositions mainly containing lead titanate zirconate ($Pb(Ti_xZr_{1-x})O_3$) or lead titanate ($PbTiO_3$) have been widely used as piezoelectric ceramic compositions for piezoelectric ceramic filters, piezoelectric ceramic oscillators, piezoelectric ceramic resonators and other piezoelectric ceramic devices. Such piezoelectric ceramic compositions mainly containing lead titanate zirconate or lead titanate inevitably contain large amounts of lead as a component, and lead oxide vaporizes during production to deteriorate the uniformity of characteristics of the produced devices. To avoid deteriorated uniformity of characteristics of the produced devices due to vaporization of lead oxide in the production step, piezoelectric ceramic compositions containing no or small amounts of lead are preferred.

In contrast, piezoelectric ceramic compositions mainly containing $SrBi_2Nb_2O_9$ or other layered bismuth compounds include no lead oxides in the composition and do not invite the above problem. However, when piezoelectric ceramic filters or oscillators are prepared using such piezoelectric ceramic compositions mainly containing $SrBi_2Nb_2O_9$ or other layered bismuth compounds, the resulting piezoelectric ceramic filters or oscillators exhibit greater temperature-dependent factors of resonant frequency than conventional compositions containing lead zirconate titanate or lead titanate, and have not yet been in wide practical use.

SUMMARY OF THE INVENTION

Accordingly, it is a main object of the invention to provide piezoelectric ceramic compositions mainly containing $SrBi_2Nb_2O_9$ which have improved temperature-dependent factors of resonant frequency frTc shown by the following equation $$frTC=(fr(\max)-fr(\min))/(fr(20° \text{ C.})\times 100)$$

wherein fr(max) is the maximum resonant frequency within the range from −20° C. to 80° C.; fr(min) is the minimum resonant frequency within the range from −20° C. to 80° C.; and fr(20° C.) is the resonant frequency at 20° C. within a temperature range from −20° C. to 80° C., and are useful as materials for piezoelectric ceramic devices, especially for piezoelectric ceramic oscillators, and to provide piezoelectric ceramic devices using the compositions.

The invention provides, in an aspect, a piezoelectric ceramic composition mainly contains a component shown by the formula $SrBi_2Nb_2O_9$ and includes at least a trivalent metallic element other than the element Bi constituting the main component in a proportion of more than 0 mol and equal to or less than about 0.15 mol relative to 1 mol of Bi in the main component.

The invented piezoelectric ceramic composition may mainly include, for example, a component of the formula $(Sr_{1-x}M_x)Bi_2Nb_2O_9$, wherein M is the trivalent metallic element other than the element Bi constituting the main component, and x is more than 0 and equal to or less than about 0.3.

The invented piezoelectric ceramic composition may mainly contain a component of the formula $(Sr_{1-x}M_{2x/3})Bi_2Nb_2O_9$, wherein M is the trivalent metallic element other than the element Bi constituting the main component, and x is more than 0 and equal to or less than about 0.45.

In the invented piezoelectric ceramic composition, the trivalent metallic element other than Bi is preferably at least one selected from, for example, La, Ce, Pr, Nd, Sm, Gd, Dy, Er, Yb, Sc and Y.

The invented piezoelectric ceramic composition may further include manganese in a proportion of more than 0% by weight and equal to or less than about 1.0% by weight calculate as $MnCO_3$.

In another aspect, the invention provides a piezoelectric ceramic device including a piezoelectric ceramic composed of the piezoelectric ceramic composition, and electrodes formed on the piezoelectric ceramic.

The invented piezoelectric ceramic composition mainly containing a compound shown by the formula $SrBi_2Nb_2O_9$ should include at least a trivalent metallic element other than the element Bi constituting the main component in a proportion of more than 0 mol and equal to or less than about 0.15 mol relative to 1 mol of Bi. If the content of the trivalent metallic element exceeds this range, the electromechanical coefficient kt is decreased and a practicable electromechanical coefficient cannot be obtained, and the temperature-dependent factor of resonant frequency is increased.

Such trivalent metallic elements other than Bi include, for example, La, Ce, Pr, Nd, Sm, Gd, Dy, Er, Yb, Sc and Y.

The present inventors also found that the electromechanical coefficient is can be improved by incorporating manganese in a proportion of about 1.0% by weight or less in terms of $MnCO_3$ into a piezoelectric ceramic composition mainly containing $SrBi_2Nb_2O_9$, in Japanese Patent Application No. 10-156648. That is also effective for the instant piezoelectric ceramic compositions, and the resulting piezoelectric ceramic compositions can yield piezoelectric ceramic devices having a high electromechanical coefficient and a low temperature-dependent factor of resonant frequency frTC.

The invented piezoelectric ceramic compositions mainly containing a component of the formula $SrBi_2Nb_2O_9$ have only to have the aforementioned composition basically, and component elements may have some deviations in molar ratios.

Further objects, features, and advantages of the present invention will become apparent from the following description of the preferred embodiments with reference to the attached drawings.

DESCRIPTION OF THE PREFERRED EMBODIMENTS

EXAMPLE 1

Figure 1:
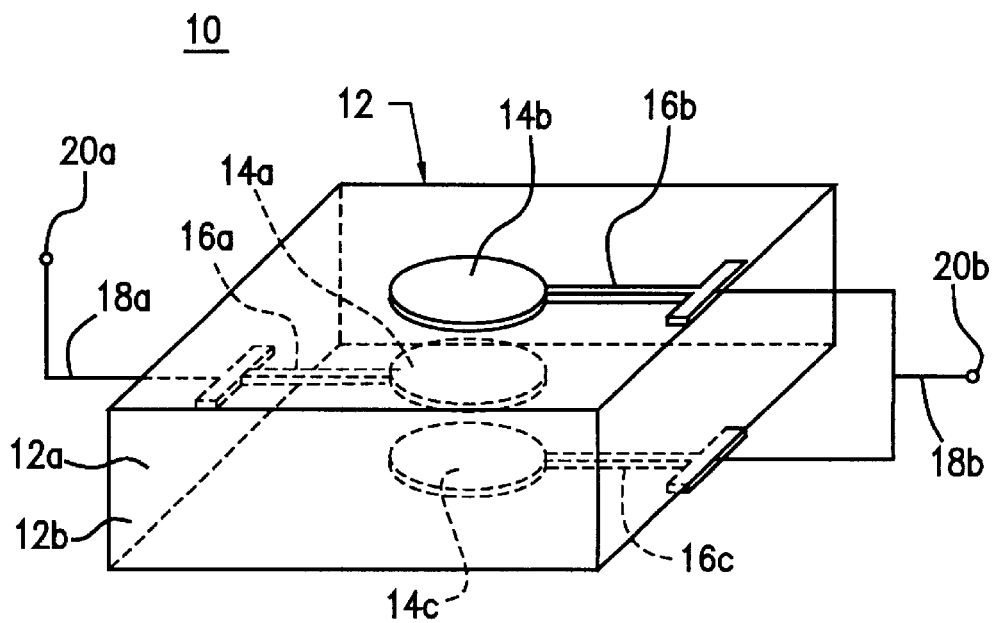
FIG. 1 is a perspective view of an embodiment of the invented piezoelectric ceramic resonator.

Starting materials, $SrCO_3$, $Bi_2O_3$, $Nb_2O_5$, $La_2O_3$, $Sm_2O_3$, $Y_2O_3$ and $MnCO_3$ were weighed to yield a composition of $(Sr_{1-x}M1_x)Bi_2Nb_2O_9$+y % by weight $MnCO_3$, wherein M1 is one selected from La, Nd, Sm and Y; $0 \leq x \leq 0.4$; and $0 \leq y \leq 1.1$. The weighed materials were wet-mixed in a ball mill for about four hours to yield a mixture. The mixture was dried and was then calcined at 700° C. to 900° C. to yield a calcined product. The calcined product was roughly ground and was wet-milled with an appropriate amount of an organic binder in a ball mill for four hours. The milled powder was passed through a 40-mesh sieve to adjust the grain size of the milled powder. The powder was then molded at a pressure of 1000 kgf/cm² into a disc 12.5 mm in diameter and 2 mm in thickness. The disk was fired at a temperature of 1100° C. to 1250° C. in the air to yield a ceramic disc. A silver paste was applied to and baked on surfaces of the ceramic disc (both principal planes) in a conventional manner to form silver electrodes. The sample was then subjected to a polarization treatment by the application of a direct-current voltage of 10 kV/mm for 10 to 30 minutes in a 150° C. to 200° C. insulating oil to yield a series of piezoelectric ceramics (samples).

Densities, electromechanical coefficients kt, and temperature-dependent factors of resonant frequency frTC of the above prepared samples were determined. The results are shown in Table 1. One should note that a half of x in the composition, i.e., x/2, corresponds to the content (mol) of M1 relative to 1 mol of Bi. In Table 1, the symbol "*" in the column of "Sample Number" indicates that the sample in question is out of the scope of the present invention.

TABLE 1

| Sample Number | MI | x | y (wt %) | Density (g/cm²) | Kt (%) | frTC (ppm/° C.) |
|---|---|---|---|---|---|---|
| 1* | — | 0 | 0 | 7.00 | 10.6 | 32.6 |
| 2 | La | 0.05 | 0 | 6.98 | 18.5 | 24.8 |
| 3 | La | 0.1 | 0 | 6.89 | 18.5 | 24.5 |
| 4 | La | 0.2 | 0 | 6.99 | 19.1 | 24.3 |
| 5 | La | 0.3 | 0 | 6.97 | 18.0 | 24.3 |
| 6* | La | 04 | 0 | 6.10 | 9.6 | 31.0 |
| 7 | Nd | 0.1 | 0 | 7.01 | 18.4 | 23.5 |
| 8 | Nd | 0.3 | 0 | 7.00 | 19.0 | 22.8 |
| 9 | Nd | 0.4 | 0 | 6.23 | 9.4 | 31.0 |
| 10 | Sm | 0.1 | 0 | 6.99 | 18.1 | 24.3 |
| 11 | Sm | 0.3 | 0 | 6.95 | 17.9 | 24.6 |
| 12 | Sm | 0.4 | 0 | 5.87 | 9.5 | 30.9 |
| 13 | Y | 0.1 | 0 | 6.88 | 18.2 | 23.1 |
| 14 | Y | 0.3 | 0 | 6.78 | 19.0 | 23.0 |
| 15* | Y | 0.4 | 0 | 6.01 | 8.0 | 32.7 |
| 16 | La | 0.1 | 0.5 | 6.99 | 19.5 | 24.6 |
| 17 | La | 0.1 | 1.0 | 6.97 | 20.1 | 24.1 |
| 18 | La | 0.1 | 1.1 | 6.22 | 10.4 | 24.2 |

EXAMPLE 2

Starting materials, $SrCO_3$, $Bi_2O_3$, $Nb_2O_5$, $La_2O_3$, $Nd_2O_3$, $Sm_2O_3$, $Y_2O_3$ and $MnCO_3$ were weighed to yield a composition of $(Sr_{1-x}M2_{2x/3})Bi_2Nb_2O_9$+y % by weight $MnCO_3$, wherein M2 is one selected from La, Nd, Sm and Y; $0 \leq x \leq 0.5$; and $0 \leq y \leq 1.1$. The weighed materials were subjected to the same procedure as in Example 1 to yield a series of piezoelectric ceramics (samples).

Electromechanical coefficients kt and temperature-dependent factors of resonant frequency frTC of the above prepared samples were determined. The results are shown in Table 2. One should note that one third of x in the composition, i.e., 2x/3, corresponds to the content (mol) of M2 relative to 1 mol of Bi. In Table 2, the symbol "*" in the column of "Sample Number" indicates that the sample in question is out of the scope of the present invention.

TABLE 2

| Number Sample | M2 | x | y (wt %) | Density (g/cm³) | Kt (%) | frTC (ppm/° C.) |
|---|---|---|---|---|---|---|
| 1* | — | 0 | 0 | 6.99 | 10.7 | 31.9 |
| 2 | La | 0.01 | 0 | 7.01 | 14.3 | 24.9 |
| 3 | La | 0.1 | 0 | 7.02 | 16.5 | 24.8 |
| 4 | La | 0.15 | 0 | 6.95 | 18.4 | 24.4 |
| 5 | La | 0.45 | 0 | 6.97 | 17.8 | 24.1 |
| 6* | La | 0.5 | 0 | 6.02 | 9.6 | 32.0 |
| 7 | Nd | 0.1 | 0 | 6.94 | 18.0 | 23.1 |
| 8 | Nd | 0.45 | 0 | 6.97 | 19.1 | 22.8 |
| 9* | Nd | 0.5 | 0 | 6.31 | 9.0 | 32.4 |
| 10 | Sm | 0.1 | 0 | 6.88 | 18.1 | 24.1 |
| 11 | Sm | 0.45 | 0 | 7.00 | 18.2 | 24.9 |
| 12* | Sm | 0.5 | 0 | 6.41 | 9.1 | 31.1 |
| 13 | Y | 0.1 | 0 | 6.90 | 15.8 | 23.5 |
| 14 | Y | 0.45 | 0 | 6.90 | 19.5 | 23.0 |
| 15* | Y | 0.5 | 0 | 6.55 | 8.5 | 31.6 |
| 16 | La | 0.15 | 0.5 | 7.01 | 20.1 | 24.5 |
| 17 | La | 0.15 | 1.0 | 7.02 | 19.0 | 24.3 |
| 18 | La | 0.15 | 1.1 | 6.11 | 10.2 | 23.5 |

Tables 1 and 2 show the reasons why the proportional ranges of individual components are specified in the invention. Specifically, the range of x is specified as $0 < x \leq 0.3$ in Example 1 and is specified as $0 \leq x \leq 0.45$ in Example 2. That is, the content of a trivalent metallic element other than the element Bi in the main component of the formula $SrBi_2Nb_2O_9$ is specified as more than 0 mol and equal to or less than about 0.15 mol relative to 1 mol of Bi in the main component. This is because if the content exceeds the above range, a practicable electromechanical coefficient kt cannot be significantly obtained, and the temperature-dependent factor of resonant frequency exceeds a practical level.

In the invention, the content of manganese should be preferably about 1.0% by weight or less in terms of $MnCO_3$. If the content of manganese exceeds this range, the electromechanical coefficient is liable not to be improved.

Tables 1 and 2 show that of individual samples according to Examples 1 and 2, samples within the scope of the invention have a temperature-dependent factor of resonant frequency frTC of 25 or less and have an electromechanical coefficient kt of 10 or more. These piezoelectric ceramic compositions are thus useful as materials for piezoelectric ceramic devices, particularly for piezoelectric ceramic oscillators or the like. When M1 or M2 is at least one of Nd and Y, the resulting piezoelectric ceramic compositions have especially low temperature-dependent factors of resonant frequency frTC.

The compositions of the invented piezoelectric ceramic compositions are not limited to those in the above examples, and any compositions within the scope of the invention are effective.

Figure 2:
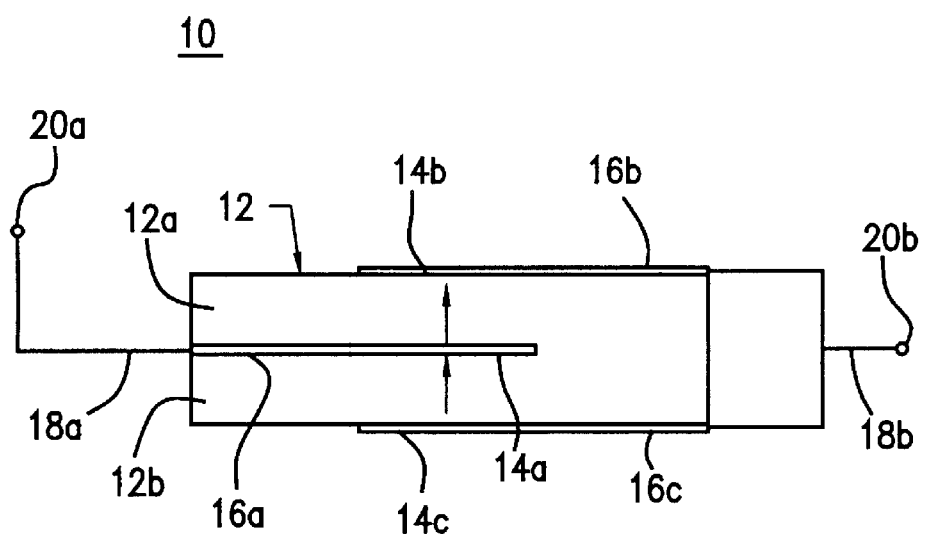
FIG. 2 is a sectional view illustrating the piezoelectric ceramic resonator shown in FIG. 1.

FIG. 1 is a perspective view of an embodiment of the invented piezoelectric ceramic resonator, and FIG. 2 is a sectional illustration thereof. A piezoelectric ceramic resonator 10 shown in FIGS. 1 and 2 includes a piezoelectric ceramic 12 of, for example, rectangular prism shape. The piezoelectric ceramic 12 includes two piezoelectric ceramic layers 12a and 12b. These piezoelectric ceramic layers 12a and 12b are composed of the invented piezoelectric ceramic composition and are integrally formed by lamination. The piezoelectric ceramic layers 12a and 12b are polarized in the same thickness direction as indicted by the arrows in FIG. 2.

In the center between the piezoelectric ceramic layers 12a and 12b, a vibrating electrode 14a of, for example, round form is formed, and a leading electrode 16a in the shape of, for example, the letter T is formed extending from the vibrating electrode 14a to one end face of the piezoelectric ceramic 12. In the center of a surface of the piezoelectric ceramic layer 12a, a vibrating electrode 14b of, for example, round form is formed, and a leading electrode 16b in the shape of, for example, the letter T is formed extending from the vibrating electrode 14b to another end face of the piezoelectric ceramic 12. In the center of a surface of the piezoelectric ceramic layer 12b, a vibrating electrode 14c of, for example, round form is formed, and a leading electrode 16c in the shape of, for example, the letter T is formed extending from the vibrating electrode 14c to the other end face of the piezoelectric ceramic 12.

One outer electrode 20a is connected to the leading electrode 16a via a lead wire 18a, and the other outer electrode 20b is connected to the leading electrodes 16b and 16c via another lead wire 18b.

The present invention can be applied to, in addition to the aforementioned piezoelectric resonator 10, other piezoelectric ceramic resonators, piezoelectric ceramic filters, piezoelectric oscillators and other piezoelectric ceramic devices.

As thus described, the invention can provide piezoelectric ceramic compositions mainly containing $SrBi_2Nb_2O_9$ which have improved temperature-dependent factors of resonant frequency frTC of 25 or less and practicable electromechanical coefficients kt and are useful as materials for, for example, piezoelectric ceramic filters, piezoelectric ceramic oscillators, piezoelectric ceramic resonators and other piezoelectric ceramic devices. The invention can also provide piezoelectric ceramic devices using the piezoelectric ceramic compositions.

Other embodiments and variations will be obvious to those skilled in the art, and this invention is not to be limited to the specific matters stated above.

What is claimed is:

1. A piezoelectric ceramic composition comprising a component represented by the formula $SrBi_2Nb_2O_9$ and comprising at least a trivalent metallic element other than the element Bi constituting the main component in a proportion of more than 0 mol and equal to or less than about 0.15 mol relative to 1 mol of Bi in the main component.

2. A piezoelectric ceramic composition according to claim 1, comprising a component represented by the formula $(Sr_{1-x}M_x)Bi_2Nb_2O_9$, wherein M is the trivalent metallic element other than the element Bi, and x is more than 0 and equal to or less than 0.3.

3. A piezoelectric ceramic composition according to claim 1, comprising a component represented by the formula $(Sr_{1-x}M_{2x/3})Bi_2Nb_2O_9$, wherein M is the trivalent metallic element other than the element Bi, and x is more than 0 and equal to or less than about 0.45.

4. A piezoelectric ceramic composition according to claim 3, wherein said trivalent metallic element other than Bi is at least one member selected from the group consisting of La, Ce, Pr, Nd, Sm, Gd, Dy, Er, Yb, Sc and Y.

5. A piezoelectric ceramic composition according to claim 3, wherein said trivalent metallic element other than Bi is Nd or Y.

6. A piezoelectric ceramic composition according to claim 5, further comprising manganese in a proportion of more than 0% by weight and equal to or less than about 1.0% by weight calculated as $MnCO_3$.

7. A piezoelectric ceramic device comprising a piezoelectric ceramic of the piezoelectric ceramic composition according to claim 6, and electrodes connected to said piezoelectric ceramic.

8. A piezoelectric ceramic composition according to claim 4, further comprising manganese in a proportion of more than 0% by weight and equal to or less than about 1.0% by weight calculated as $MnCO_3$.

9. A piezoelectric ceramic device comprising a piezoelectric ceramic of the piezoelectric ceramic composition according to claim 8, and electrodes connected to said piezoelectric ceramic.

10. A piezoelectric ceramic composition according to claim 2, wherein said trivalent metallic element other than Bi is at least one member selected from the group consisting of La, Ce, Pr, Nd, Sm, Gd, Dy, Er, Yb, Sc and Y, and further optionally comprising manganese in a proportion equal to or less than about 1.0% by weight calculated as $MnCO_3$.

11. A piezoelectric ceramic composition according to claim 10, wherein said trivalent metallic element other than Bi is Nd or Y.

12. A piezoelectric ceramic composition according to claim 10, wherein the manganese is more than 0% by weight.

13. A piezoelectric ceramic composition according to claim 1, wherein said trivalent metallic element other than Bi is at least one member selected from the group consisting of La, Ce, Pr, Nd, Sm, Gd, Dy, Er, Yb, Sc and Y.

14. A piezoelectric ceramic composition according to claim 13, wherein said trivalent metallic element other than Bi is Nd or Y.

15. A piezoelectric ceramic composition according to claim 14, further comprising manganese in a proportion of more than 0% by weight and equal to or less than about 1.0% by weight calculated as $MnCO_3$.

16. A piezoelectric ceramic device comprising a piezoelectric ceramic of the piezoelectric ceramic composition according to claim 15, and electrodes connected to said piezoelectric ceramic.

17. A piezoelectric ceramic composition according to claim 13, further comprising manganese in a proportion of more than 0% by weight and equal to or less than about 1.0% by weight calculated as $MnCO_3$.

18. A piezoelectric ceramic device comprising a piezoelectric ceramic of the piezoelectric ceramic composition according to claim 17, and electrodes connected to said piezoelectric ceramic.

19. A piezoelectric ceramic composition according to claim 1, further comprising manganese in a proportion of more than 0% by weight and equal to or less than about 1.0% by weight calculated as $MnCO_3$.

20. A piezoelectric ceramic device comprising a piezoelectric ceramic of the piezoelectric ceramic composition according to claim 19, and electrodes connected to said piezoelectric ceramic.

* * * * *